United States Patent [19]

Smith

[11] Patent Number: 5,982,712

[45] Date of Patent: Nov. 9, 1999

[54] METHOD AND APPARATUS FOR MEASURING TIME INTERVALS BETWEEN ELECTRICAL SIGNALS

[75] Inventor: Patrick A. Smith, Beaverton, Oreg.

[73] Assignee: Tektronix, Inc., Wilsonville, Oreg.

[21] Appl. No.: 08/855,065

[22] Filed: May 13, 1997

[51] Int. Cl.⁶ .......................................................... G04F 8/00
[52] U.S. Cl. .................................................................. 368/120
[58] Field of Search ............................ 368/113–120, 107

[56] References Cited

U.S. PATENT DOCUMENTS

| 4,433,919 | 2/1984 | Hoppe | 368/120 |
|---|---|---|---|
| 4,600,994 | 7/1986 | Hayashi | 364/484 |
| 4,603,292 | 7/1986 | Russell | 368/120 |
| 4,613,951 | 9/1986 | Chu | 368/120 |

*Primary Examiner*—Bernard Roskoski
*Attorney, Agent, or Firm*—Garth E. Janke; Boulden G. Griffith; Thomas F. Lenihan

[57] ABSTRACT

A method and apparatus for measuring time intervals between electrical signals. A coincidence detection circuit is adapted to detect coincidence or near coincidence of two signals and to provide for selection from a plurality of predetermined delays to remove the coincidence. If the two input signals are periodic and have the same frequency, the apparatus also provides a signal from which both the time delay between the signals and the period of the signals may be determined at substantially the same point in time.

21 Claims, 6 Drawing Sheets

METHOD AND APPARATUS FOR MEASURING TIME INTERVALS BETWEEN ELECTRICAL SIGNALS

BACKGROUND OF THE INVENTION

This invention relates to electrical measuring and counting devices, particularly to such devices known in the art as universal counter timers adapted for measuring frequency and time intervals between electrical signals.

Universal counter timers ("UCTs") are typically employed to measure frequency and time intervals between two electrical signals. For time interval measurements, a first electrical signal is provided to a first channel of the UCT and a second electrical signal is provided to a second channel of the UCT. The UCT is typically employed to measure the elapsed time between the time the first signal rises to a predetermined amplitude and the time the second signal rises to the same, predetermined amplitude. If the first electrical signal and second electrical signal are periodic and have the same frequency, the measured time delay may be compared to the period of the signals and a phase delay may be derived from the time delay and period. If the signals are a periodic, it is often desirable simply to determine the time delay between a selected portion of the first signal and a selected portion of the second signal.

It has been a problem in UCTs generally to measure time delays that are small, e.g., on the order of the set-up and hold time of the UCT. Such time delays are manifest in, inter alia, the phase delay between periodic signals that are coincident or nearly coincident in time (hereinafter "coincident"). The UCT typically determines the time delay between two signals by forming a pulse having a width representative thereof, and measuring the pulse width. But as the pulse width narrows, the frequency spectrum of the pulse is increased. Therefore, the bandwidth of the downstream measuring circuitry generally needs to be increased commensurately. Thence, there is generally a hardware cost penalty to accommodating the measurement of very small time delays using this approach. Moreover, there is generally an absolute lower limit on the time delay between two signals which can be measured. As the speed of electronic hardware has increased, the problem has been minimized; however, at the same time it often becomes more desirable to measure smaller delays. Thence, the problem still remains to an often unacceptable degree.

Often, the manufacturer of the UCT refers to this "dead zone" and warns the user that measurements there within are not reliable. However, some manufacturers fail to acknowledge the dead zone and claim instead that measuring phase delay anywhere within the full 360 degree range is permissible when, in fact, it is not. In any case, a practical result of attempting to measure, with prior art UCTs, small time delays, is to obtain erroneous measurements. Moreover, the UCT generally gives no indication that the delay between input signals meets a condition that causes the UCT to produce erroneous measurements. Rather, the user is left to infer this condition from the reported measurement and its perceived unlikeliness in the context of the user's understanding and expectation.

One attempt at solution of the aforementioned problem known in the art is to delay one or the other signal by a predetermined amount and account for the predetermined delay in subsequent computation. Thence, if the time delay between the two signals is less than the minimum pulse width that can be measured in the UCT, an appropriate predetermined delay may be employed to widen the pulse so that the dead zone is avoided and, theoretically, a time delay may be reported that is equal to zero.

However, a predetermined delay that is effective to move one pair of signals out of the dead zone may move another pair of signals into the dead zone. For example, a predetermined delay that moves a first pair of signals having a first phase relationship out of the dead zone will cause another pair of signals having a phase relationship that is reversed from the first phase relationship to move into the dead zone. In the same way, a predetermined delay imposed between a pair of signals will move the signals out of the dead zone if the signals have the same phase; however, the signals will be moved into the dead zone if the signals differ in phase by an amount corresponding to the predetermined delay. Further, if the predetermined delay happens to be equal to the period of periodic signals, the delay will have no effect on the signals. It can be appreciated that a predetermined delay imposed between a pair of signals cannot be relied upon with certainty to remove coincidence where the signals are permitted to have arbitrary phase relationships and periods.

Where it is desired to measure the phase delay of two periodic signals having the same frequency, the UCT must determine both the time delay between the two signals and the period of the signals in order to express a result in, typically, degrees of phase. Accordingly, the time delay and the period are inherently temporally related in a measurement of phase delay. This is particularly important when it is desired to know the phase delay at a particular time, such as in gating while making simultaneous measurements. Notwithstanding this temporal relationship, time delay and period are generally determined sequentially in UCTs or, if measured coincidently, are determined with different hardware. In the former case, inaccuracy may be introduced by employing two different periods of a signal for determining the two parameters. In the latter case, the expense of additional hardware must generally be incurred.

Accordingly, there is a need for a method and apparatus for measuring time intervals between electrical signals that provides for accurate measurement of the time intervals over an entire range of possible time or phase delays, including small time or phase delays, and that provides for accurate measurement of the phase delay between two periodic signals.

SUMMARY OF THE INVENTION

The method and apparatus for measuring time intervals between electrical signals of the present invention solves the aforementioned problems and meets the aforementioned need by employing a coincidence detection circuit and a novel time interval pulse shaping circuit in a UCT.

The coincidence detection circuit is adapted to detect coincidence of two signals provided to the UCT and to provide for selection from a plurality of predetermined delays to remove the coincidence so that a time delay between the signals can be accurately measured with the UCT. The predetermined delays are selected so that at least one of the predetermined delays is available to remove the coincidence for any time delay between the two signals. Alternatively, the coincidence detection circuit may be employed simply to notify the user of an error condition in the event that coincidence is detected.

The time interval pulse shaping circuit generates a train of one or more time interval pulses derived from the two signals. If the signals are not coincident, the time interval pulses have widths which are substantially equal to the time delay between the two signals. Thence, the widths of the time interval pulses may be employed to determine the time delay. Moreover, if the signals are periodic and have the same frequency, the period of the time interval pulses substantially equals the period of the signals. Thence, the same time interval pulse that is employed for measuring time delay may be employed in a measurement of period, so that the time delay and a substantially contemporaneous period are available for determining phase delay. Therefore, the inherent temporal relationship between the time delay and period may be maintained in the determination of phase delay.

However, if the signals are coincident, the coincidence detection circuit indicates the coincidence and the pulse widths are not employed in the UCT for measurement. However, if the signals are periodic and have the same frequency, the period of the time interval pulses may still be employed to determine the period of the signals. That is, when the signals are coincident, the period of the time interval pulses is substantially equal to twice the period of the signals, so that the period of the signals may be determined by measuring the period of the time interval pulses and dividing by two.

Preferably, two counters are employed for measuring the time delay between the signals and the period of the signals. A first counter counts the number of clock pulses of a system clock signal between the edges of a first of the time interval pulses, to provide for a measurement of the time delay between the signals, and a second counter counts the number of clock pulses of the system clock signal between corresponding edges of the first time interval pulse and a consecutive or adjacent second of the time interval pulses, to provide for a measurement of the period of the signals. Therefore, a phase delay computed from the results of the first and second counters retains the inherent temporal relationship between time delay and period to provide for improved accuracy.

Preferably, a third counter is employed for counting the number of the time interval pulses over a selected period of time, thereby providing a divisor for averaging the measurements of the first and second counters.

Therefore, it is a principal object of the present invention to provide a novel and improved method and apparatus for measuring time intervals between electrical signals.

It is another object of the present invention to provide such a method and apparatus which provides for measuring small time or phase delays between two signals.

It is still another object of the present invention to provide such a method and apparatus which provides for measuring small time or phase delays between two signals in a standard universal counter timer.

It is yet another object of the present invention to provide such a method and apparatus which increases the accuracy of a measurement of the phase delay between two electrical signals.

It is a further object of the present invention to provide such a method and apparatus which minimizes sensitivity to time variance in the input signals and internal electrical parameters, and which minimizes or eliminates the need for matching circuits employed for performing measurements of time delay and signal period.

The foregoing and other objects, features and advantages of the present invention will be more readily understood upon consideration of the following detailed description of the invention, taken in conjunction with the following drawings.

DETAILED DESCRIPTION OF A PREFERRED EMBODIMENT

Figure 1:
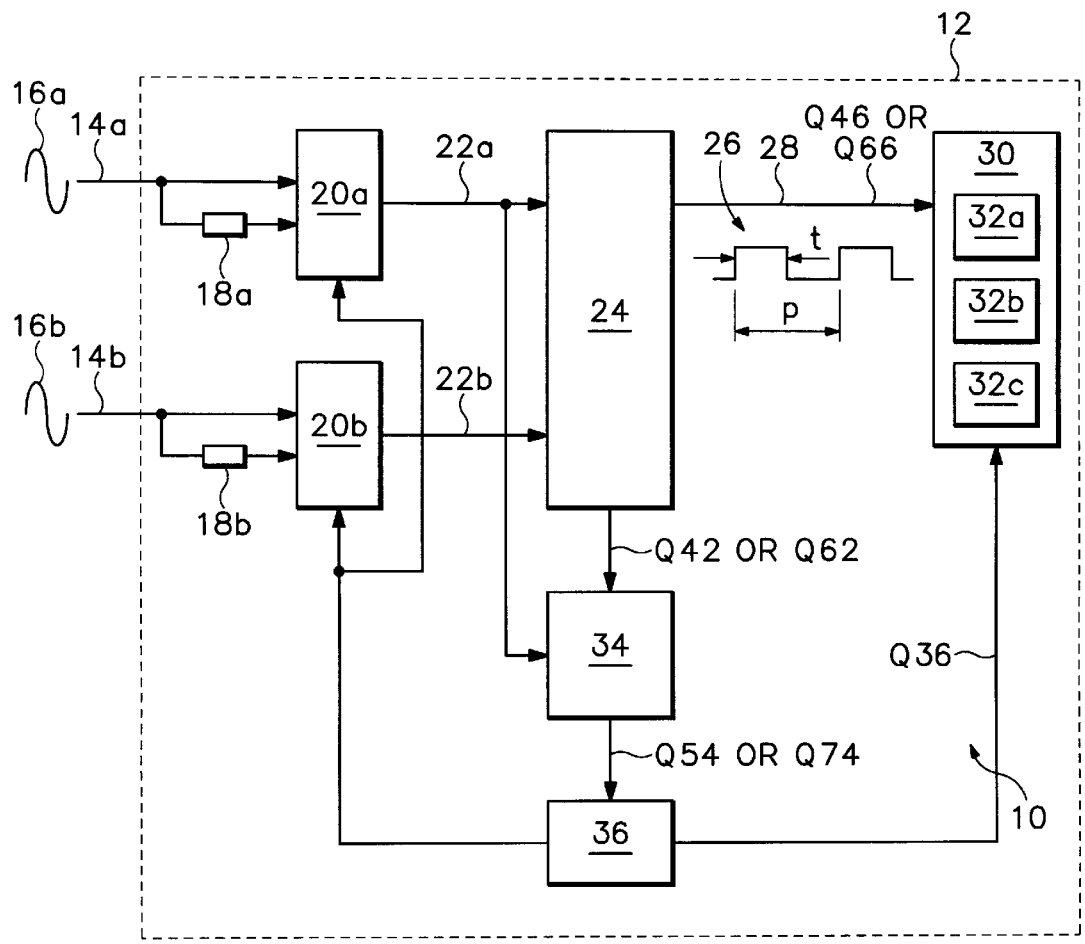
FIG. 1 is a block diagram of an apparatus for measuring time intervals between electrical signals according to the present invention.
Figure 2A:
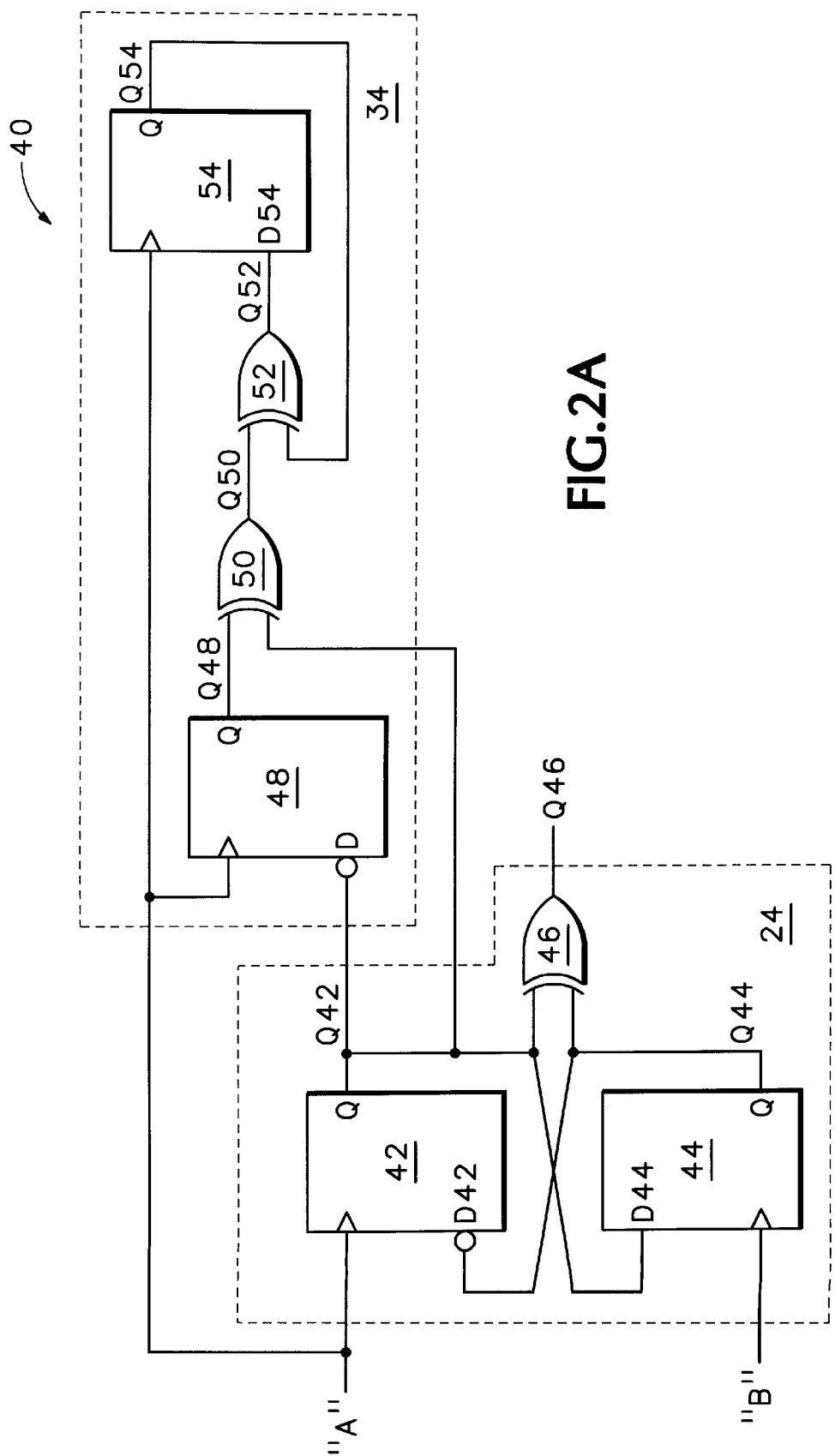
FIG. 2A is a schematic of a first time interval pulse shaping circuit and coincidence detection circuit according to the present invention.
Figure 2B:
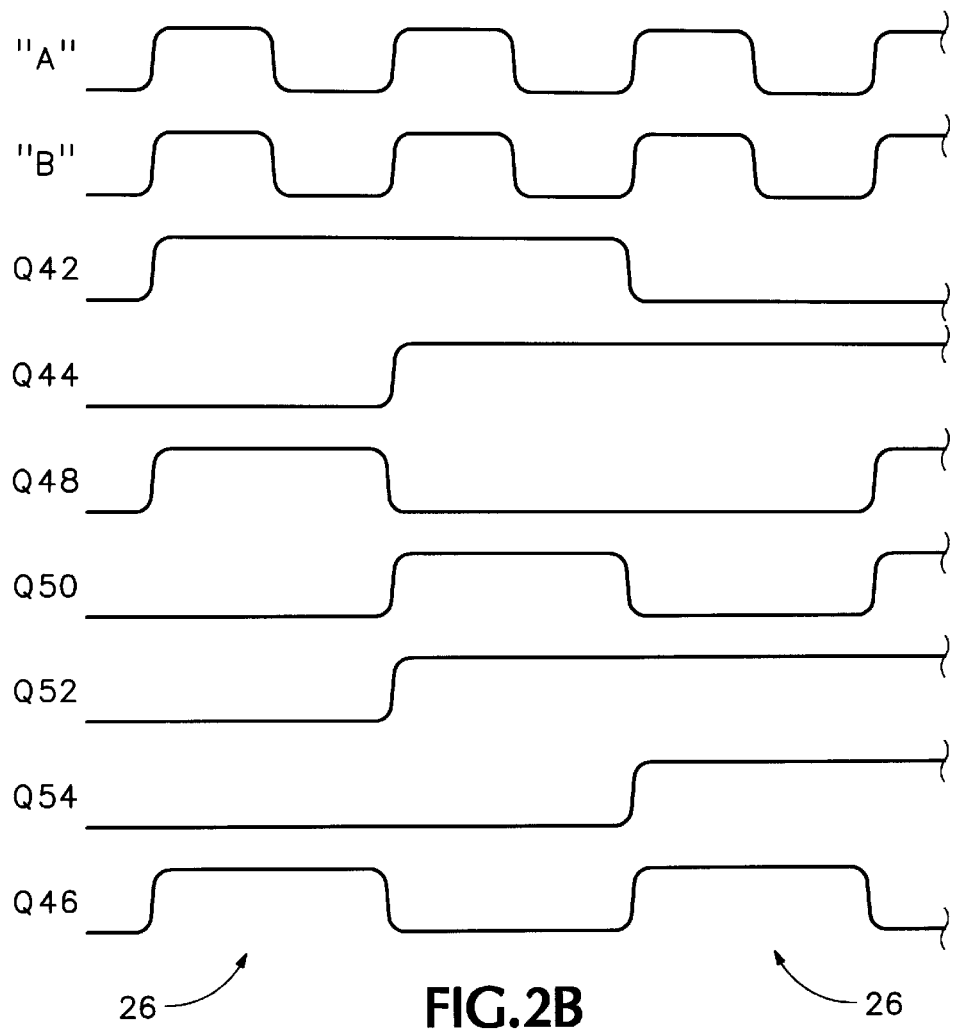
FIG. 2B is a timing diagram for the time interval pulse shaping circuit and coincidence detection circuit of FIG. 2A, for signals "A" and "B" that are coincident.

Referring to FIGS. 1, 2A and 2B, a preferred embodiment of an apparatus 10 for measuring time intervals between electrical signals according to the present invention is employed in a universal counter/timer ("UCT") 12, the UCT 12 having a first electrical input 14a and a second electrical input 14b for receiving first and second electrical signals 16a and 16b, between which it is desired to determine a time or phase delay. The UCT generally has additional functions as well which are not the particular focus of the present invention and will not be described.

The inputs 14a, 14b are electrically connected to respective delay lines 18a, 18b as well as to respective switches 20a, 20b, such as multiplexers, for switching between the signals 16a, 16b or delayed versions thereof. The delay lines preferably incorporate fixed, predetermined delays; however, the delay lines may be variable and adjusted at any time without departing from the principles of the invention. While two switches and respective delay lines are shown as preferred, any number of switches and respective delay lines, including only one switch and delay line, may be employed in the apparatus 10 without departing from the principles of the invention.

The switches 20a, 20b provide respective outputs 22a, 22b which are provided to a time interval pulse shaping circuit 24. The time interval pulse shaping circuit produces a train of one or more time interval pulses 26 at a time interval pulse output 28. A time interval pulse has a width "t" that corresponds to the elapsed time between (1) the start time when the amplitude of the output 22a equals a trigger value, and (2) the stop time when the amplitude of the output 22b equals substantially the same trigger value. The trigger value may be any value of the amplitude of the signals that has an acceptably definite location in time thereon, but is usually selected to lie somewhere along the rising or falling edges of the signals. Thence, for convenience, such values are referred to hereinafter as edges.

The time interval pulses 26 are provided to a pulse width measuring circuit 30. Among other things, the pulse width measuring circuit is adapted to measure the width "t" of the pulses 26, for determining the time delay between the signals. However, as the signals become more closely coincident, the pulse width "t" becomes smaller. Thence, the bandwidth of the counters and associated logic circuitry in the pulse width measuring circuit must increase commensurately to permit measuring the width, ultimately reaching a limit beyond which measurements become erroneous. Notwithstanding, there is typically no indication provided in the UCT that the limit has been reached for a pair of signals which are coincident. Without such an indication the typical fixed delay which is inserted between the signals cannot be intelligently invoked; so that coincidence may not be removed generally, for any pair of signals.

According to the present invention, however, a coincidence detection circuit 34 is provided which produces a coincidence signal for signaling whether coincidence is detected between the outputs 22a and 22b. The coincidence signal is provided to a processor 36 which is adapted to enable the switches 20a, 20b, to control the relative delay inserted between the signals 16a, 16b. When coincidence is detected, the processor preferably disregards the current measurement of the width of the pulse 26 and enables one, the other, or neither of the switches 20a, 20b to insert or remove the associated delays and thereby remove the coincidence or maintain non-coincidence. The processor may, either in the alternative or in addition, report a value of the time delay that is within the dead zone range of coincidence as an estimate of the time delay between the signals during coincidence. The estimate is particularly advantageous if a single shot measurement is being made, and is nearly as accurate as prior art measurements in a UCT of the time delay between signals that are not coincident.

Alternatively, the processor may simply notify the user of an error condition corresponding to the detection of coincidence. Notwithstanding the capability of the invention to detect coincidence and take correction action, substitute an estimate or notify the user, a time interval measurement made between the outputs 22a and 22b wherein the outputs are coincident may be employed in computations or reported to the user, if the user desires, without departing from the principles of the invention.

It can be seen that with an appropriate selection of predetermined delays of the delay lines 18a, 18b, coincidence may be removed in this manner for a pair of signals bearing any fixed temporal relationship. Moreover, the temporal relationship of the two signals may change with time and the apparatus 10 may yet be capable of removing the coincidence, so long as the rate of change of the temporal relationship of the two signals is less than the slew rate of the apparatus, to recognize and respond to the change by switching the delay lines 18a, 18b.

The processor 36 determines an actual time delay between the signals 16a, 16b from the measured width of a pulse 26 by adjusting the measured pulse width by the amount of the time delays of the delay lines 18a, 18b as they are known to have been employed by the processor. The processor may also compensate the measured delay for any other known, differential delays between the signals that are introduced by the apparatus 10; however, these should be minimal in a careful design.

Referring to FIG. 2A, a "two edge" embodiment 40 of the coincidence detection circuit 34 and time interval pulse shaping circuit 24 will be described. The two edge embodiment 40 includes rising edge triggered D flip-flops 42, 44. The flip-flops 42, 44 have respective clock inputs to which are provided signals "A", corresponding to output 22a, and "B", corresponding to output 22b, between which it is desired to detect coincidence. The flip-flops 42 and 44 have respective signal outputs Q42, Q44 which are fed back to data inputs D44, D42 respectively of the other flip-flop, Q44 being inverted for provision to D42. The outputs Q42 and Q44 are also provided as the inputs to an exclusive OR gate 46 having an output Q46. Q42 is also inverted and provided as data to a rising edge triggered D flip-flop 48.

The signal "A" is also provided to a clock input of a rising edge triggered D flip-flop 48. An output Q48 of the flip-flop 48 and the output Q42 are provided to an exclusive OR gate 50 having an output Q50. The signal "A" is also provided to a rising edge triggered D flip-flop 54 having a coincidence flag output Q54. Q54 and Q50 are provided as the inputs to an OR gate 52 having an output Q52, the output Q52 being provided to the data input D54 of the flip-flop 54, to form a feed-back loop.

Referring to FIG. 2B, the outputs Q42, Q44, Q46, Q48, Q50, Q52 and Q54 are initially set (or reset) to zero. Then, the timing diagram depicted in FIG. 2B may be obtained for signals "A" and "B" which are coincident within the set-up and hold times of the flip-flops 42 and 44. In particular, it can be seen that Q46 represents a periodic signal having twice the period of the signals "A" and "B," and it can be seen that Q52 represents a signal that toggles high to detect coincidence, detection having occurred on the second rising edge of the signals "A" and "B."

However, if "A" substantially precedes "B" with respect to the set-up and hold time of the flip-flops, the outputs Q48 and Q42 toggle together so that Q50 is always zero. In the alternative, if "B" precedes "A", it can be seen that the result is the same, as the first clocking of "B", at flip-flop 44, effects no change of state and, thereafter, the circuit can be analyzed as though "A" precedes "B."

Figure 3A:
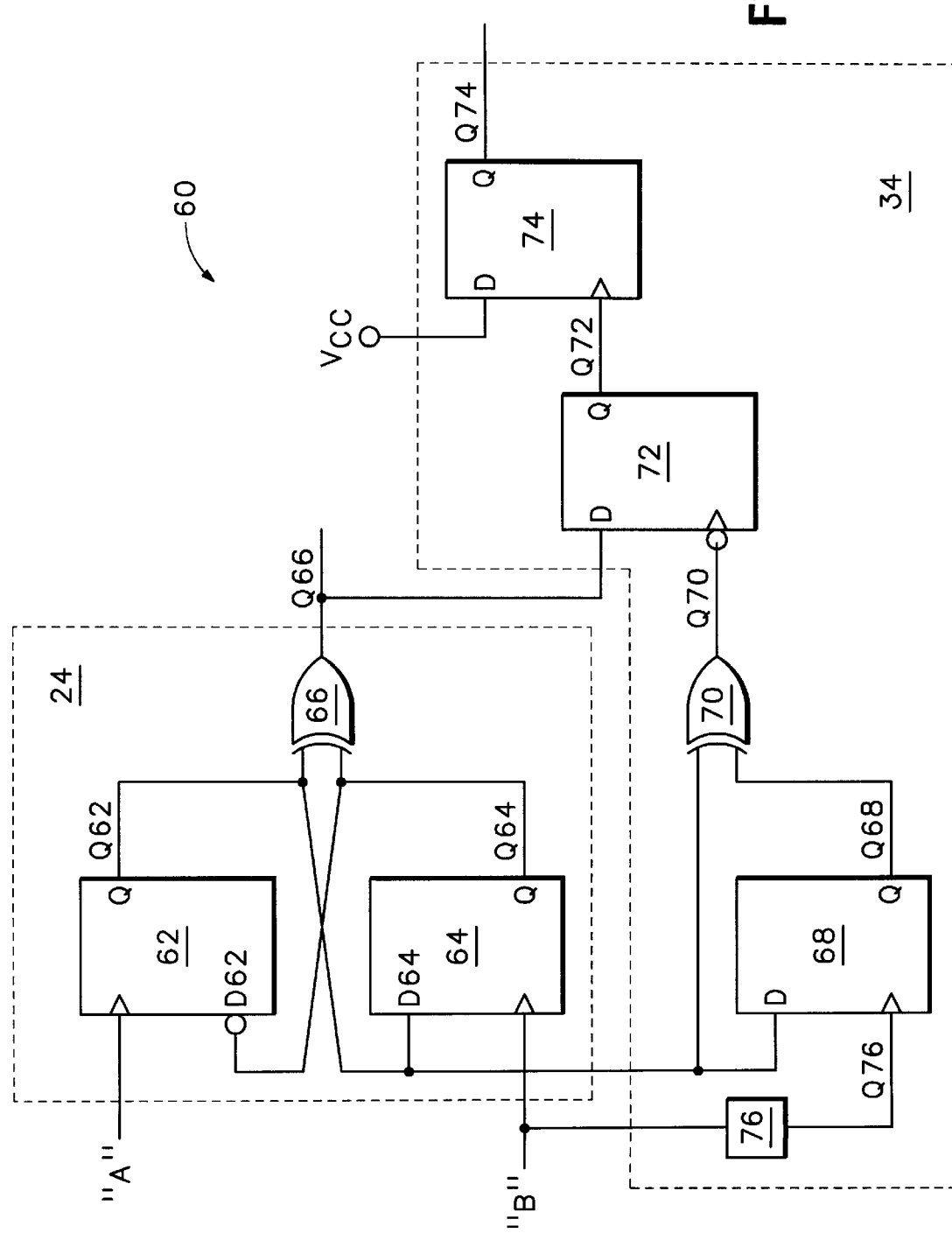
FIG. 3A is a schematic of a second time interval pulse shaping circuit and coincidence detection circuit according to the present invention.

Referring to FIG. 3A, a "single edge" embodiment 60 of the coincidence detection circuit 34 and time interval pulse shaping circuit 24 will be described. The single edge embodiment 60 includes rising edge triggered D flip-flops 62, 64. The flip-flops 62, 64 have respective clock inputs to which are provided signals "A", corresponding to output 22a, and "B", corresponding to output 22b, between which it is desired to detect coincidence. The flip-flops 62 and 64 have respective signal outputs Q62, Q64 which are fed back to data inputs D64, D62 respectively of the other flip-flop, Q64 being inverted for provision to D62. The outputs Q62 and Q64 are also provided as the inputs to an exclusive OR gate 66 having an output Q66. The output Q62 is further provided as data to a rising edge triggered D flip-flop 68.

The signal "B" is provided to a delay line 76 having a delay that is greater than the set-up and hold time of the flip-flop 62. The delayed signal "B" is then provided, as Q76, to the clock input of the flip-flop 68. An output Q68 of the flip-flop 68 and the output Q62 are provided as the inputs to an exclusive OR gate 70 having an output Q70. The output Q70 is inverted and applied to the clock input of a rising edge triggered D flip-flop 72 having an output Q72. The output Q66 of the exclusive OR gate 66 is applied to the data input of the flip-flop 72. The output Q72 is applied to the clock input of a rising edge triggered D flip-flop 74 having a coincidence flag output Q74 and having its data input tied high so as to latch the output Q72.

Figure 3B:
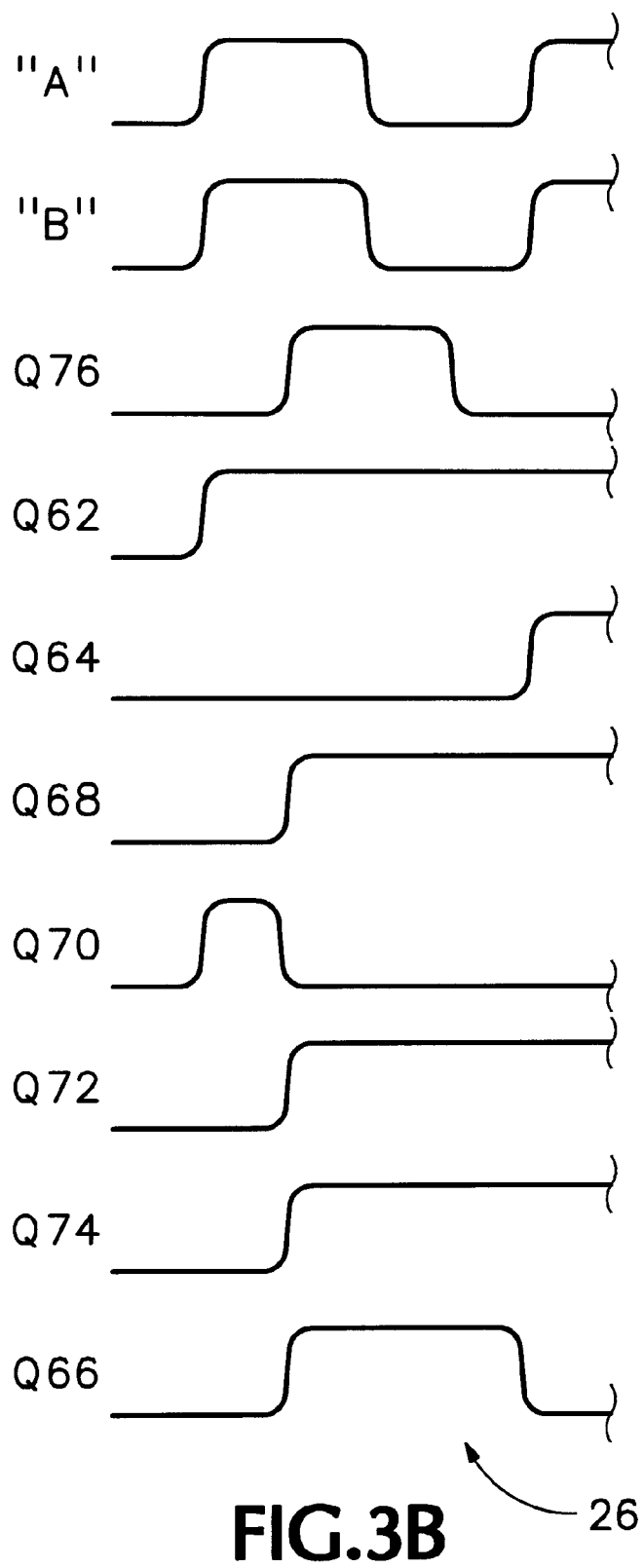
FIG. 3B is a timing diagram for the time interval pulse shaping circuit and coincidence detection circuit of FIG. 3A, for signals "A" and "B" that are coincident.

Referring to FIG. 3B, the outputs Q62, Q64, Q66, Q68, Q70, Q72 and Q74 are initially set (or reset) to zero. Then, the timing diagram depicted in FIG. 3B may be obtained for signals "A" and "B" which are coincident within the set-up and hold times of the flip-flops 62 and 64. In particular, just as for Q46 in the aforedescribed "two edge" embodiment, Q66 represents a periodic signal having twice the period of the signals "A" and "B." It can also be seen that Q72 toggles high to indicate coincidence, Q72 being latched by the flip-flop 74 as a detection signal. Thence, in the embodiment 60, detection occurs at a time delayed from the first rising edge of the signals "A" and "B."

However, if "A" substantially precedes "B" with respect to the set-up and hold time of the flip-flops, the output Q70 always clocks in a low Q66, so that Q72 remains low. That is, when the data input of flip-flop 72, i.e., Q66, is high, the clock input of the flip-flop is on its falling edge and, when the clock input of the flip-flop is on its rising edge, Q66 is low. In the alternative, if "B" precedes "A", it can be seen that the result is the same, as the first clocking of "B", at flip-flop 64, effects no change of state and thereafter the circuit can be analyzed as though "A" precedes "B."

An advantage of the second embodiment 60 is that only a single edge is needed to detect coincidence and, therefore, it is generally preferred. However, the single edge embodiment 60 may also require a careful selection of the delay line 76. Either of the aforementioned embodiments of the coincidence detection circuit 34, as well as other embodiments thereof, provide for the advantage of detecting and signaling the coincidence, so that appropriate and desired action may be taken.

The output Q46 or Q66 of the time interval pulse shaping circuit 24 comprises the aforedescribed time interval pulses 26. The width and period of the pulses are measured by the pulse width measuring circuit 30 to determine either or both the time delay between the signals "A" and "B" and the period thereof, the measurements being temporally associated to provide for a superior determination of phase delay than has heretofore been realized in the art. In FIGS. 2B and 3B, the signals "A" and "B" are shown as being coincident. In that case, the period of the pulses 26 in the output Q46 or Q66 is equal to twice the period of the signals as aforementioned. Also in that case, the output Q46 or Q66 is not representative of the time delay between the signals.

On the other hand, if the signals "A" and "B" are not coincident, the widths of the pulses 26 produced by the time interval pulse shaping circuit 30 are substantially equal to the time delay between the signals, and the period of the pulses 26 is substantially equal to the period of the signals as will next be described.

Figure 2C:
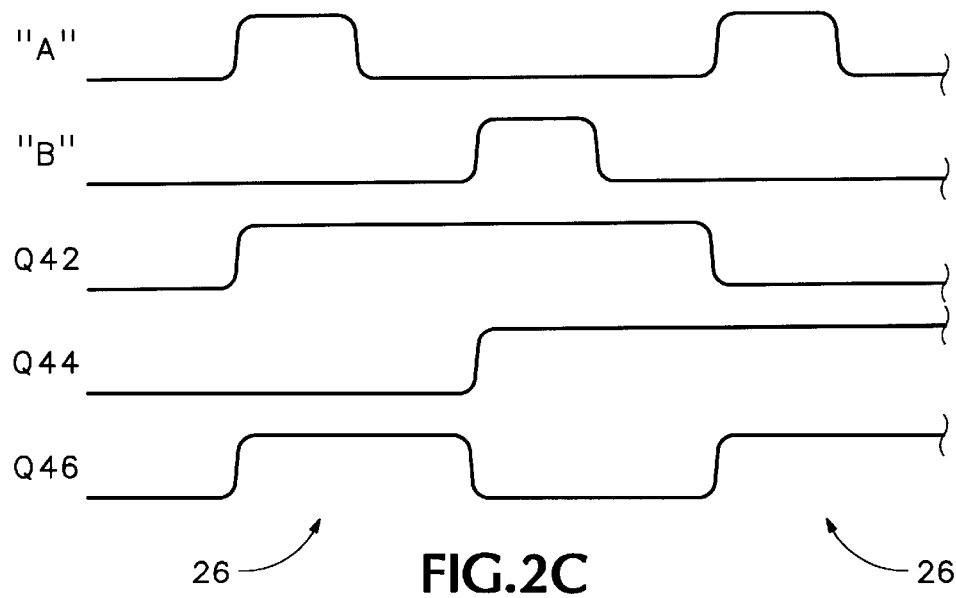
FIG. 2C is a timing diagram corresponding to a portion of the timing diagram of FIG. 2B for signals "A" and "B" that are not coincident.

Referring to FIG. 2C, a timing diagram corresponding to a portion of the timing diagram of FIG. 2B is shown for signals "A" and "B" that are not coincident. Referring again to FIG. 2A, with all of the outputs set (or reset) to zero, the first rising edge of "A" clocks the negated low value of Q44 into Q42 through flip-flop 42, bring Q42 high, while the first riding edge of "B" clocks the high value of Q42 into Q44 through flip-flop 44. The second rising edge of "A" then clocks the negated high value Q44 into Q42, bringing Q42 low. It can be seen that the exclusive OR gate 46 produces an output Q46 of the embodiment 40 of the time interval pulse shaping circuit 35 which comprises pulses 26 having widths which are equal to the time delay between the signals "A" and "B", and having a period that is equal to the period of the signal "A." The same result is obtained for the output Q66 of the embodiment 60 of the time interval pulse shaping circuit 24, which employs a similar structure.

Figure 4A:
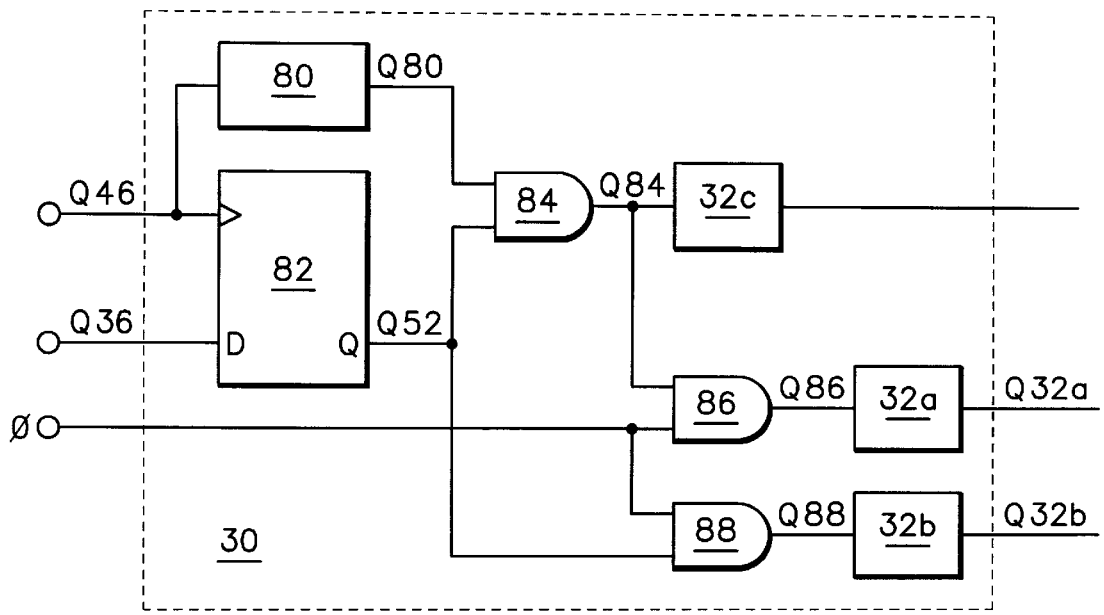
FIG. 4A is a schematic of a pulse width measuring circuit according to the present invention.
Figure 4B:
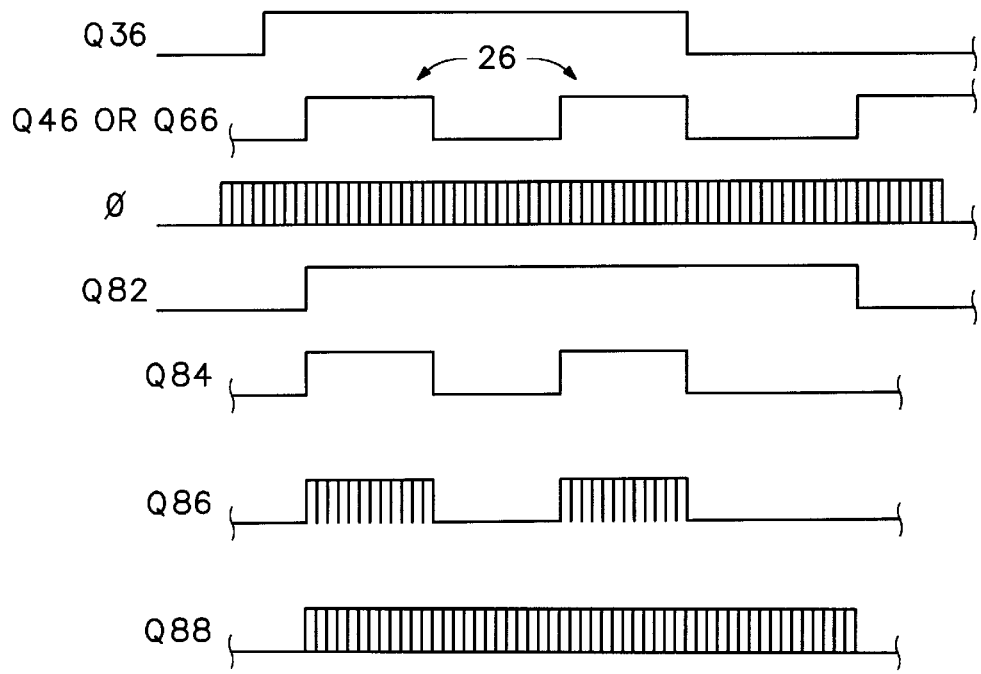
FIG. 4B is a timing diagram for the pulse width measuring circuit of FIG. 4A.

Referring to FIGS. 4A and 4B, a simplified schematic of the pulse width measuring circuit 30 for measuring the aforementioned width and period of the pulses 26 is provided. Preferably, the apparatus 10 is adapted to permit hardware or other averaging of the measurements of a plurality of the pulses 26. Accordingly, the processor 36 provides an event select signal Q36 which represents a user selection of a number of events over which it is desired to average. The number of events may be equal to any number, including one. Each event corresponds to one of the pulses 26. For each event selected, one pulse 26 is measured for time delay and, if the signals "A" and "B" are periodic, one period between two consecutive pulses 26 is measured. When more than one event is selected, the pulse widths and periods are divided by the number of events for averaging.

The event select signal 36 is provided to the data input of a rising edge triggered, D flip-flop 82. The signal Q46 of the first embodiment 40 of the time interval pulse shaping circuit 24 is illustrated in FIG. 4B and is employed for purposes of illustration. The signal Q46 is provided to the clock input of the flip-flop 82 and, in parallel, is passed through a delay line 80. A first gate output Q82 of the flip-flop 82 and an output Q80 of the delay line 80 are provided as the inputs to an AND gate 84. A second gate output Q84 of the gate 84 and a clock signal $\phi$ of the system clock are provided as the inputs to an AND gate 86. The clock signal is then gated by the second gate output Q84 and a time delay output Q86 is made available to a time interval counter 32a. The time delay output Q86 contains a number of clock pulses which fit between the rising and falling edges of each of the pulses 26 therein. The counter 32a then counts the clock pulses to determine a time delay sum.

Substantially in parallel to the provision of the second gate output Q84 and the clock signal $\phi$ to the AND gate 86, for clocking the counter 32a, the first gate output Q82 and the clock signal $\phi$ are provided as the inputs to an AND gate 88, which produces a period output Q88 for clocking a period counter 32b. The period output Q88 contains the number of clock pulses which fit between the rising edges of corresponding, consecutive pulses 26 therein. The counter 32b then counts the clock pulses to determine a period sum.

The number of clock pulses counted by the counter 32a for one of the time interval pulses 26 corresponds to the time delay between the signals "A" and "B", and the number of clock pulses counted by the parallel counter 32b for one of the periods corresponds to the period of the signals. Thence, the counter 32a provides a measurement of the time delay between the signals and the counter 32b provides a temporally associated measurement of the period of the signals. Therefore, a phase delay computed from the outputs Q32a and Q32b of the counters retains the inherent temporal relationship between time delay and the period to provide for improved accuracy.

Preferably, a third counter 32c is employed for counting the number of the time interval pulses 26, thereby providing a "divisor" for averaging the time delay and period sums of the counters 32a and 32b respectively. Preferably the averaging is performed in hardware. The third counter 32c is clocked by the second gate output Q84. The counter 32c counts the number of events by counting the number of pulses 26 in the second gate output Q84.

In FIG. 4B, two events are shown as being selected for averaging by the event select signal 36. Thence, two pulses 26 of Q46 are selected for measurement of time delay at Q86, and two substantially contemporaneous periods of the pulses 26 are measured at Q88. The two measurements of time delay and the two measurements of period may be averaged for the two events by dividing the measurements by two.

If the signals "A" and "B" are coincident, the output Q46 or Q66 is construed by the processor 36 to contain consecutive pulses 26 which define a period that is twice the period of the signals "A" and "B", as aforementioned. Accordingly, if the signals are coincident, the aforementioned period sum is further divided by two. Otherwise, the period of the pulses 26 may be employed directly to obtain the period sum.

It is possible that two signals having the same period will at the margin, due to noise, exite the coincidence detection circuit 34 so that it appears to the coincidence detection circuit that the signals are coincident during one period and not coincident during a consecutive other period. The invention still provides a correct determination of the period of the signals, because sufficient information exists in the time interval counter 32a, the period counter 32b and the coincidence flag Q54 or Q74 to deduce the period.

Suppose, for example, that two input signals having the same period are provided to the coincidence detection circuit and that, on first rising edges of the pulses, it appears that signal A precedes signal B so that the signals are not coincident but, on following rising edges of the pulses, it appears that signal A and signal B are coincident. Taking for example Q46 of the two-edge embodiment 40 of the coincidence detection circuit 24, if A precedes B, Q46 rises on the rising edge of A and falls on the rising edge of B, so that its width, in a first pulse representative of the first period of the signals A and B, is equal to the perceived delay between the signals A and B. This will be recognized by the apparatus 10 as a small number in the time interval counter 32a. On the second period of the signals, however, Q46 rises on the first edges of the signals and thereafter its behavior is as shown in FIG. 2B. The coincidence flag will be set high soon after coincidence is detected as aforedescribed and the apparatus would normally assume the period of the signals A and B to be equal to half the period of Q46, which would be incorrect. However, since the time interval counter 32a evidences a relatively small number, the apparatus may determine the aforedescribed condition and assume, instead, that the period is equal to the period of Q46. The same result obtains for the single edge embodiment 60 of the coincidence detection circuit 24.

Suppose in the alternative that, on temporally corresponding first pulses of the signals, the signals appear coincident, however on subsequent pulses the signals are everywhere non-coincident so that A precedes B. Then, a first pulse of Q46 rises at the first rising edges of A and B, makes no change at the second rising edge of A and falls at the second rising edge of B. The coincidence flag is then set, so the apparatus would normally assume that the period of the signals A and B is equal to one-half the period of the first pulse of Q46, the period being assumed to be equal to twice the width of the pulse. Thence, the apparatus would normally assume that the period of the signals A and B is equal to the width of the first pulse of Q46, which would be correct. The apparatus may determine that the assumption is correct in this case because the time interval counter 32a evidences a relatively large number.

An arbitrary case in which input signals of marginal coincidence and having the same period yet appear to vary in coincidence may be constructed from the above examples. In general, the state of coincidence can be determined in the apparatus 10 from information contained in the counters 32a and 32b and the status of the coincidence flag. Accordingly, it will be appreciated that the apparatus 10, then, exhibits a desirable robustness.

In order to simplify the above discussions, the pulses 26 have been generally described as having a single width and as occurring with a single period. However, it is to be recognized that the aforementioned width and period of the pulses 26 is generally time dependent, so that different pulses 26 may have different widths and different consecutive pairs of the pulses 26 may have different periods, depending on how the temporal relationship between the signals "A" and "B" changes with time. The present invention is particularly well adapted to account for these time dependencies.

It is further to be recognized that, while a specific method and apparatus for measuring time intervals between electrical signals has been shown as preferred, other configurations could be utilized, in addition to configurations already mentioned, without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

I claim:

1. A circuit for measuring time intervals in a time interval measuring device, comprising:

a first electrical input for receiving a first electrical signal;

a second electrical input for receiving a second electrical signal;

a time Interval pulse shaping circuit coupled to said first and said second electrical inputs and adapted for producing a time interval pulse signal representative of the time interval between said first and said second electrical signals;

a time interval measuring circuit having a third electrical input for receiving a clock signal, said clock signal having a shorter period than said time interval pulse signal, said time interval measuring circuit being coupled to said time interval pulse shaping circuit and adapted for measuring said time interval pulse signal by counting transitions of said clock signal occurring during said time interval pulse signal to produce a time interval measurement; and a coincidence detection circuit adapted for detecting and signaling a coincidence between said first and said second electrical signals that is within a limited range, so that the relative accuracy of said time interval measurement may be determined.

2. The circuit of claim 1, further comprising a first delay circuit having a first delay input and a first delay output, said first delay input being coupled to said first electrical input, said first delay circuit being adapted for delaying the first electrical signal a first predetermined amount, and a switching circuit having a first switching input switchable between said first delay output and said first electrical input, wherein, when said coincidence is detected, said switching circuit switches said first switching input from one of said first delay output and said first electrical input to the other.

3. The circuit of claim 2, further comprising a second delay circuit having a second delay input and a second delay output, said second delay input being coupled to said second electrical input, said second delay circuit being adapted for delaying the second electrical signal a second predetermined amount, wherein said switching circuit includes a second switching input switchable between said second delay output and said second electrical input, wherein, when said coincidence is detected, said switching circuit selects one of said first and said second delay circuits and switches the corresponding one of said first and said second switching inputs from the corresponding one of said first and said second delay outputs and the corresponding one of said first and said second electrical inputs, to the other.

4. The circuit of claim 1, further comprising a processing circuit adapted for processing said time interval measurement, wherein, when the length of said time interval signal is within said limited range and said coincidence detection circuit detects said coincidence, said processing circuit ignores said time interval measurement.

5. The circuit of claim 1, further comprising a processing circuit adapted for processing said time interval measurement, wherein, when the length of said time interval signal is within said limited range and said coincidence detection circuit detects said coincidence, said processing circuit reports said time interval measurement to be within said limited range.

6. The circuit of claim 1, wherein said coincidence detection circuit detects said coincidence from a single edge of said first and said second electrical signals.

7. A circuit for measuring time intervals in a time interval measuring device, comprising:

a first electrical input for receiving a first electrical signal;

a second electrical input for receiving a second electrical signal; a time interval pulse shaping circuit coupled to said first and said second electrical inputs and adapted for producing a time interval pulse signal representative of the time interval between said first and said second electrical signals;

a period measuring circuit having a third electrical input for receiving a clock signal, said clock signal having a shorter period than said time interval pulse signal, said time interval measuring circuit being coupled to said time interval shaping circuit and adapted for measuring the period of said time interval pulse signal by counting transitions of said clock signal occurring during said time interval pulse signal; and a coincidence detection circuit, adapted for detecting and signaling a coincidence between said first and said second electrical signals that is within a limited range, wherein, if said coincidence is detected, the period of at least one of said first and said second electrical signals is substantially equal to half the period of said time interval signal, and wherein, if said coincidence is not detected, the period of said at least one of said first and said second electrical signals is substantially equal to the period of said time interval signal.

8. The circuit of claim 7, further comprising a processing circuit adapted to selectably produce an estimate of a time delay when said coincidence is detected, wherein, if said coincidence is detected and said processing circuit produces said estimate, said processing circuit determines a phase delay by dividing said estimate by the measured period of said time interval signal.

9. In a universal counter timer, a circuit for measuring time intervals, comprising:

a first electrical input for receiving a first electrical signal;

a second electrical input for receiving a second electrical signal; a time interval pulse shaping circuit coupled to said first and said second electrical inputs and adapted for producing a time interval pulse signal representative of the time interval between said first and said second electrical signals and the period of at least one of said first and said second electrical signals;

a time measuring circuit having a third electrical input for receiving a clock signal, said clock signal having a shorter period than said time interval pulse signal, said time interval measuring circuit being coupled to said time interval shaping circuit and adapted for measuring said time interval signal by counting transitions of said clock signal occurring during said time interval pulse signal to produce a time delay measurement a processing circuit coupled to said time measuring circuit and adapted for determining a phase delay from said time delay measurement and said period measurement, said period measurement being measured from substantially the same point in time as said time delay; and a coincidence detection circuit adapted for detecting and signaling a coincidence between said first and said second electrical signals that is within a limited range, so that the relative accuracy of said time interval measurement may be determined.

10. The circuit of claim 9, wherein said time interval signal is produced so as to include a plurality of pulses having widths representative of said time delay, said time delay being represented by a first of said pulses, said period being represented by the distance between an edge of said first pulse and a consecutive edge of an adjacent second of said pulses.

11. The circuit of claim 10, further comprising a coincidence detection circuit adapted for detecting and signaling a coincidence between said first and said second electrical signals that is within a limited range, wherein, if said coincidence is detected, the period of at least one of said first and said second electrical signals is substantially equal to half said distance between said edges, and wherein, if said coincidence is not detected, the period of at least one of said first and said second electrical signals is substantially equal to said distance.

12. A method for measuring time intervals in a time interval measuring device, comprising:

receiving a first electrical signal;

receiving a second electrical signal;

producing a time interval pulse signal representative of the time interval between said first and said second electrical signals;

receiving a clock signal having a period shorter than said time interval pulse signal;

measuring said time interval signal by counting transitions of said clock signal occurring within said time interval pulse signal; and detecting and signaling a coincidence between said first and said second electrical signals that is within a limited range for determining accuracy of said measurement.

13. The method of claim 12, further comprising, if said coincidence is detected, selectably delaying one or the other of said first and said second electrical signals an amount sufficient to remove said coincidence.

14. The method of claim 12, further comprising, if said coincidence is detected, further comprising ignoring the results of said measuring.

15. The method of claim 12, further comprising, if said coincidence is detected, reporting the results of said measuring to be within said limited range.

16. The method of claim 12, further comprising detecting said coincidence from a single edge of said first and said second electrical signals.

17. A method for measuring time intervals in a time interval measuring device, comprising:

receiving a first electrical signal;

receiving a second electrical signal; producing a time interval pulse signal representative of the period of at least one of said first and said second electrical signals;

receiving a clock signal having a period shorter than said time interval pulse signal;

measuring the period of said time interval pulse signal by counting transitions of said clock signal occurring within said time interval pulse signal; and detecting a coincidence between said first and said second electrical signals that is within a limited range and, if said coincidence is detected, assuming the period of said at least one of said first and said second electrical signals to be substantially equal to half the period of said time interval pulse signal and, if said coincidence is not detected, assuming the period of said at least one of said first and said second electrical signals to be substantially equal to the period of said time interval pulse signal.

18. The method of claim 17, further comprising selectably producing an estimate of a time delay when said coincidence is detected and determining a phase delay by dividing said estimate by the measurement of said period of said time interval signal.

19. In a universal counter timer, a method for measuring time intervals, comprising:

receiving a first electrical signal;

receiving a second electrical signal; producing a time interval signal representative of the time delay between said first and said second electrical signals and a substantially contemporaneous period of at least one of said first and said second electrical signals;

receiving a clock signal having a period shorter than said time interval pulse signal;

measuring said time interval signal for producing a time delay measurement by counting transitions of said clock signal occurring within said time interval pulse signal; measuring said time interval signal by counting transitions of said clock signal occurring within said time interval pulse signal for producing a period measurement; and determining a phase delay from said time delay measurement and said period measurement.

20. The method of claim 18, further comprising producing a plurality of pulses having widths representative of said time delay, forming said time interval signal from said pulses wherein said measuring said time interval for producing said time delay measurement measures the width of a first of said pulses, and wherein said measuring said time interval signal for producing said period measurement measures the distance between an edge of said first pulse and a corresponding edge of an adjacent second of said pulses.

21. The method of claim 20, further comprising detecting and signaling a coincidence between said first and said second electrical signals that is within a limited range, wherein, if said coincidence is detected, said determining said phase delay comprises dividing said time delay measurement by substantially about half of said period measurement, and wherein, if said coincidence is not detected, said determining comprises dividing said time delay measurement by about said period measurement.

* * * * *